United States Patent
Lee

(10) Patent No.: US 9,142,541 B2
(45) Date of Patent: Sep. 22, 2015

(54) SEMICONDUCTOR DEVICE HAVING INDUCTOR

(71) Applicant: VIA TECHNOLOGIES, INC., New Taipei (TW)

(72) Inventor: Sheng-Yuan Lee, New Taipei (TW)

(73) Assignee: VIA TECHNOLOGIES, INC., New Taipei (TW)

( * ) Notice: Subject to any disclaimer, the term of this patent is extended or adjusted under 35 U.S.C. 154(b) by 0 days.

(21) Appl. No.: 14/076,419

(22) Filed: Nov. 11, 2013

(65) Prior Publication Data

US 2014/0210044 A1    Jul. 31, 2014

Related U.S. Application Data

(60) Provisional application No. 61/758,423, filed on Jan. 30, 2013.

(30) Foreign Application Priority Data

Jul. 11, 2013   (TW) .............................. 102124858 A

(51) Int. Cl.
*H01L 27/02* (2006.01)
*H01L 23/522* (2006.01)

(52) U.S. Cl.
CPC ........ *H01L 27/0248* (2013.01); *H01L 23/5227* (2013.01); *H01L 2924/0002* (2013.01)

(58) Field of Classification Search
CPC ............ H01L 23/5221; H01L 23/5381; H01L 2924/19051; H01L 27/0248; H01L 23/5227; H01L 2924/0002
USPC .......................................... 257/531; 336/200
See application file for complete search history.

(56) References Cited

U.S. PATENT DOCUMENTS

| | | | |
|---|---|---|---|
| 6,635,949 B2 * | 10/2003 | Lowther et al. | 257/531 |
| 6,967,555 B2 | 11/2005 | Yu et al. | |
| 7,005,939 B2 * | 2/2006 | Zerbe et al. | 333/100 |
| 7,091,814 B2 * | 8/2006 | Kyriazidou | 336/200 |
| 7,526,256 B2 * | 4/2009 | Bhatti | 455/73 |
| 7,724,116 B2 | 5/2010 | Lee | |
| 8,355,229 B2 | 1/2013 | Sakai | |

(Continued)

FOREIGN PATENT DOCUMENTS

| | | |
|---|---|---|
| CN | 1405801 | 3/2003 |
| CN | 1889205 | 1/2007 |
| CN | 101719415 | 6/2010 |
| JP | 2004-335761 | 11/2004 |

(Continued)

*Primary Examiner* — Yu Chen
*Assistant Examiner* — Nilufa Rahim
(74) *Attorney, Agent, or Firm* — McClure, Qualey & Rodack, LLP

(57) ABSTRACT

A semiconductor device including a first insulating layer and a second insulating layer sequentially disposed on a substrate is disclosed. A first conductive line and a second conductive line are disposed in the first insulating layer, and each of the first and second conductive lines has a first end and a second end, wherein the second ends of the first and second conductive lines are coupled to each other. A first winding portion and a second winding portion are disposed in the second insulating layer, and each of the first and second winding portions includes a third conductive line and a fourth conductive line arranged from the inside to the outside. Each of the third and fourth conductive lines has a first end and a second end, wherein the first and second conductive lines overlap at least a portion of the third conductive lines.

15 Claims, 10 Drawing Sheets

(56) References Cited

U.S. PATENT DOCUMENTS

2012/0092119 A1\* 4/2012 Kireev et al. ................. 336/200
2013/0249660 A1\* 9/2013 Ler et al. ....................... 336/200

FOREIGN PATENT DOCUMENTS

JP 2005-191217 7/2005
WO WO 2011/004803 1/2011

\* cited by examiner

SEMICONDUCTOR DEVICE HAVING INDUCTOR

CROSS REFERENCE TO RELATED APPLICATIONS

This application claims the benefit of U.S. Provisional Application No. 61/758,423, filed on Jan. 30, 2013, the entirety of which is incorporated by reference herein.

This application claims priority of Taiwan Patent Application No. 102124858, Filed on Jul. 11, 2013, the entirety of which is incorporated by reference herein.

BACKGROUND OF THE INVENTION

1. Field of the Invention

The invention relates to a semiconductor device, and in particular to a semiconductor device having an inductor.

2. Description of the Related Art

Many digital/analog devices and circuits have been successfully applied to semiconductor integrated circuits. Such devices may include passive components, such as resistors, capacitors, or inductors. The typical semiconductor integrated circuit includes a silicon substrate. One or more dielectric layers are disposed on the substrate, and one or more metal layers are disposed in the dielectric layers. The metal layers may be employed to form on-chip elements, such as on-chip inductors, by the current semiconductor technologies.

The on-chip inductor is formed on a substrate and includes a metal layer and an interconnect structure. The metal layer surrounds from the outside to the inside with respect to a center region, and is embedded in an upper insulating layer on the substrate. Moreover, the metal layer closest to the center region further surrounds from the inside to the outside, and is embedded in the upper insulating layer on the substrate. The interconnect structure includes an upper connection layer embedded in the upper insulating layer, and first conductive plugs and a lower connection layer embedded in a lower insulating layer. A current path is created by the metal layer, the first conductive plugs, and the upper and lower connection layers so as to electrically connect to the internal or external circuits of the chip. Two ends of the metal layer are at the outermost coil thereof and each of the ends connects to an extending portion. The two extending portions are parallel to each other and may be connected to various circuit elements. Moreover, the aforementioned on-chip inductor may further include a branch structure. The branch structure is connected to the innermost coil of the metal layer through a second conductive plug embedded in the lower insulating layer. Particularly, the extending direction of the branch structure is perpendicular to that of the two extending portions at the two ends of the metal layer as viewed from a plan view of the on-chip inductor.

An equivalent circuit composed of the two extending portions and the branch structure of the aforementioned on-chip inductor is a T-coil. Circuit parameters of the T-coil include a first inductance, a second inductance and a coupling parameter. The first inductance value and second inductance value are proportional to wiring lengths. For example, an inductance value is determined by the wiring length from one end of the outermost coil of the metal layer to the connecting location of the innermost coil and the branch structure, and another inductance value is determined by the wiring length from another end of the outermost coil to the location of the branch structure. Moreover, the coupling parameter value is varied with the first inductance value and second inductance value. The first inductance value, the second inductance value and the coupling parameter value are usually adjusted by changing the connecting location of the innermost coil of the metal layer and the branch structure.

However, since the connecting location of the innermost coil of the metal layer and the branch structure is limited within a range of a side length of the innermost coil of the metal layer, the structure of the conventional on-chip inductor makes it difficult to meet various circuit-design demands. Moreover, since the first inductance value, the second inductance value and the coupling parameter value are all varied with the location of the branch structure, it is difficult to adjust the circuit parameters of the on-chip inductor.

Thus, there exists a need in the art for development of a semiconductor device having an inductor capable of mitigating or eliminating the aforementioned problems.

BRIEF SUMMARY OF THE INVENTION

A detailed description is given in the following embodiments with reference to the accompanying drawings. A semiconductor device and method for forming the same are provided.

An exemplary embodiment of a semiconductor device according to the invention is provided. The semiconductor device comprises a first insulating layer and a second insulating layer sequentially disposed on a substrate having a center region. A first conductive line and a second conductive line are disposed in the first insulating layer and surround the center region. Each of the first and second conductive lines has a first end and a second end. The second ends of the first and second conductive lines are coupled to each other. A first winding portion and a second winding portion are disposed in the second insulating layer and surround the center region. Each of the first and second winding portions comprises a third conductive line and a fourth conductive line arranged from the inside to the outside. Each of the third and fourth conductive lines has a first end and a second end. A coupling portion is disposed in the first and second insulating layers between the first winding portion and the second winding portion, and comprises a first pair of connection layers cross-connecting the first ends of the third conductive lines and the first ends of the first and second conductive lines, and a second pair of connection layers cross-connecting the second ends of the third and fourth conductive lines. The first and second conductive lines overlap at least a portion of the third conductive lines.

Another exemplary embodiment of a semiconductor device according to the invention is provided. The semiconductor device comprises a first insulating layer and a second insulating layer sequentially disposed on a substrate having a center region. A first winding portion and a second winding portion are disposed in the second insulating layer and surround the center region. Each of the first and second winding portions comprises a first conductive line, a second conductive line and a third conductive line arranged from the inside to the outside. Each of the first, second and third conductive lines has a first end and a second end. The first ends of the first conductive lines are coupled to each other. A coupling portion is disposed in the first and second insulating layers between the first and second winding portions, and comprises a first pair of connection layers cross-connecting the second ends of the first and second conductive lines, and a second pair of connection layers cross-connecting the first ends of the second and third conductive lines. A plurality of spacings between the first conductive lines and the second conductive lines adjacent thereto are the same or different. At least one of the spacings is greater than the spacing between the second conductive lines and the third conductive lines adjacent thereto.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
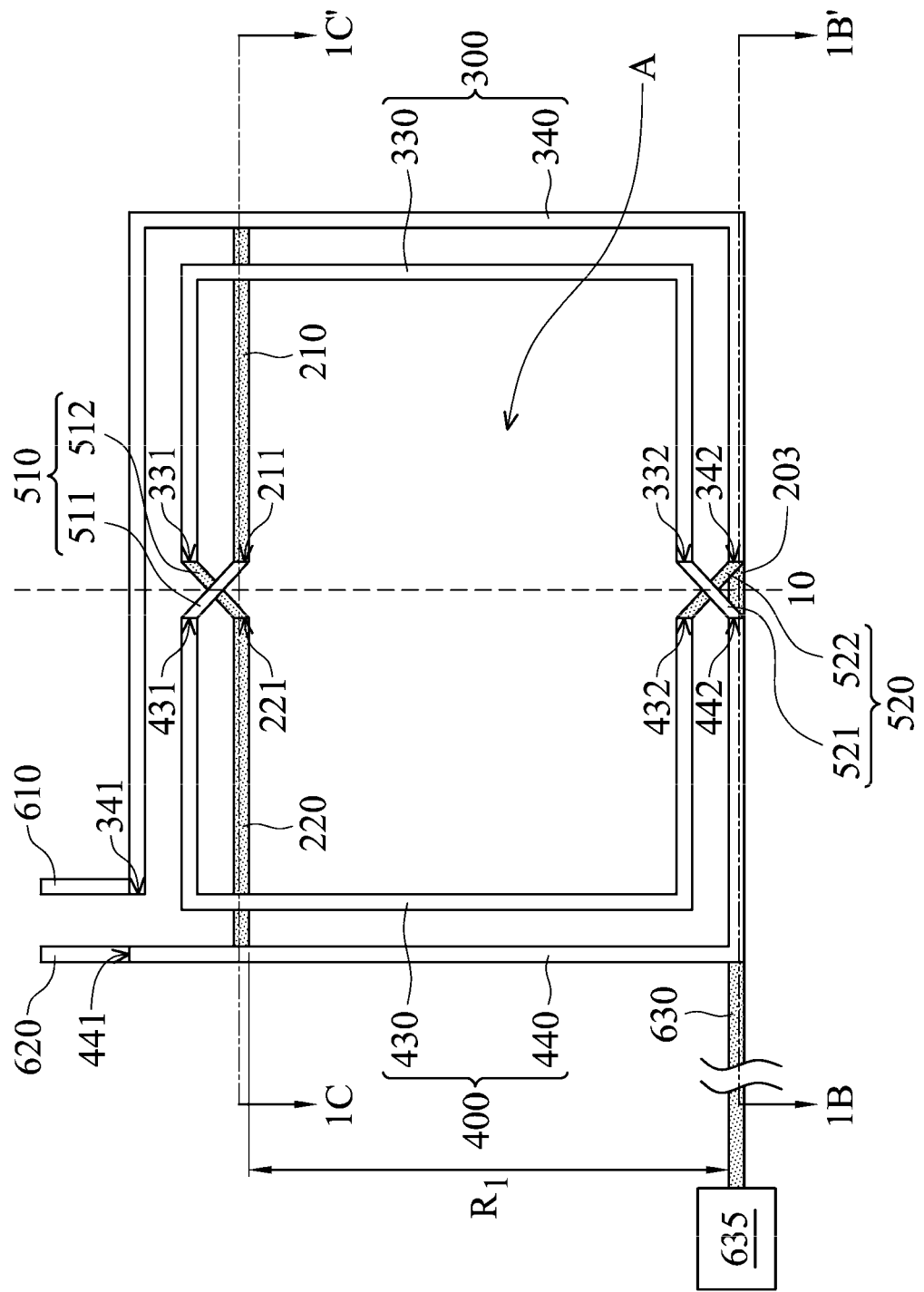
FIG. 1A is a plan view of an exemplary embodiment of a two-turn inductor according to the invention.

The following description is of the best-contemplated mode of carrying out the invention. This description is provided for the purpose of illustrating the general principles of the invention and should not be taken in a limiting sense. The scope of the invention is best determined by reference to the appended claims. Moreover, the same or similar elements in the drawings and the description are labeled with the same reference numbers.

Figure 1B:
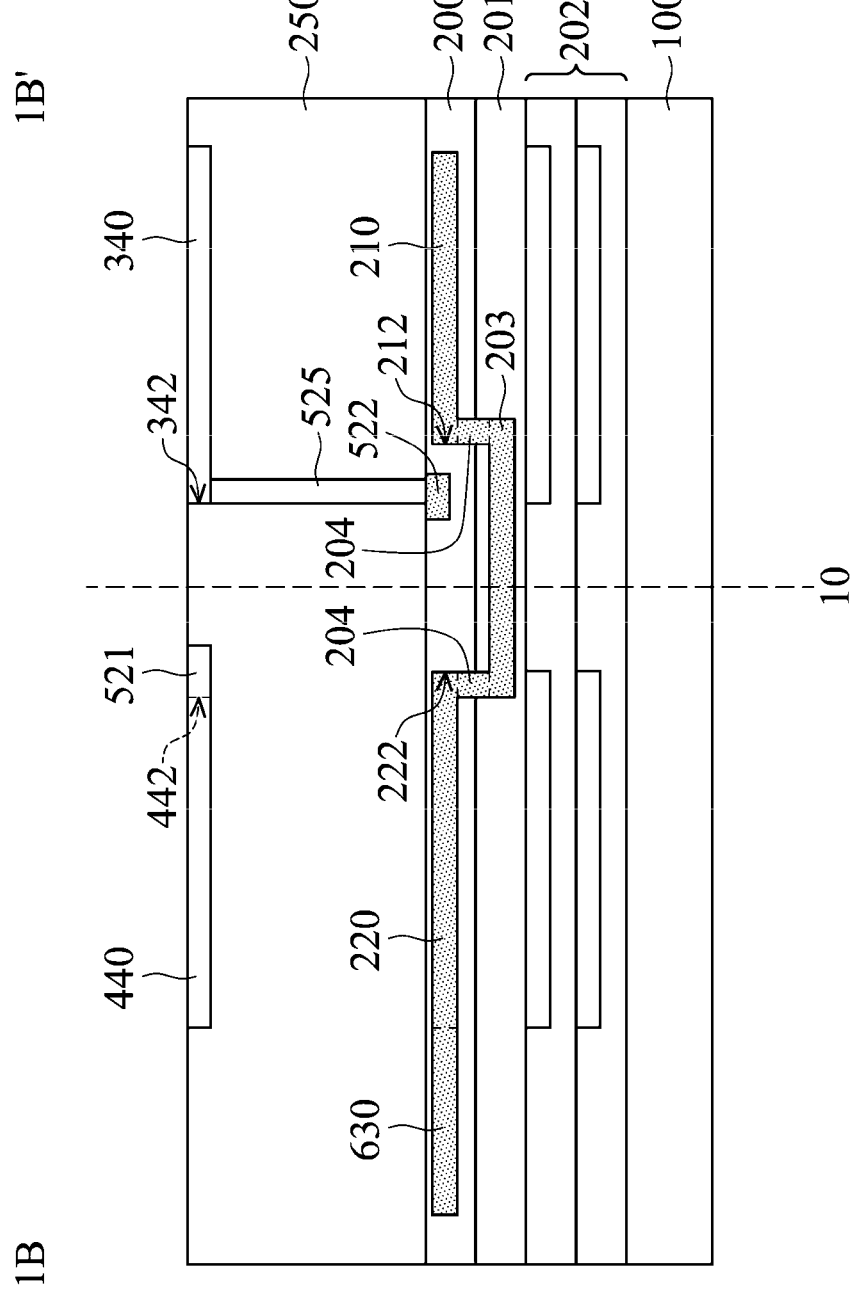
FIG. 1B is a cross-sectional view along the line 1B-1B' in FIG. 1A.
Figure 1C:
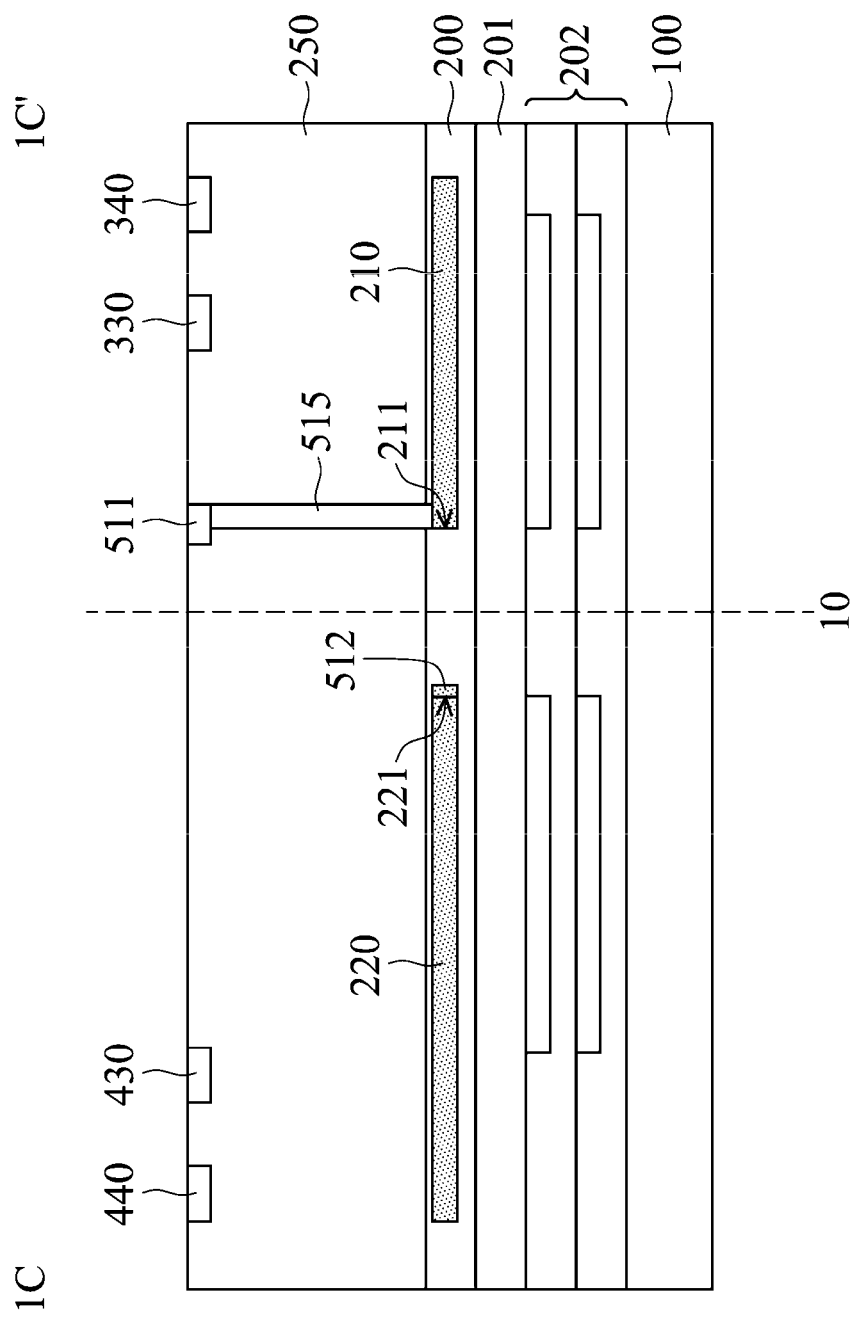
FIG. 1C is a cross-sectional view along the line 1C-1C' in FIG. 1A.

An exemplary embodiment of a semiconductor device having a two-turn inductor according to the invention is illustrated with FIGS. 1A to 1C, in which FIG. 1A is a plan view of a two-turn inductor, FIG. 1B is a cross-sectional view along the line 1B-1B' in FIG. 1A, and FIG. 1C is a cross-sectional view along the line 1C-1C' in FIG. 1A.

A semiconductor device having a two-turn inductor comprises a substrate 100 having a center region A, as shown in FIG. 1A. A first insulating layer 200 and a second insulating layer 250 are sequentially disposed on the substrate 100. The substrate 100 may comprise a silicon substrate or other semiconductor substrates well known in the art. The substrate 100 may include various elements, such as transistors, resistors, or other semiconductor elements well known in the art. Moreover, the substrate 100 may also include other conductive layers, such as copper, aluminum, or alloy thereof, and other insulating layers, such as silicon oxide, silicon nitride, or low-k dielectric material. To simplify the diagram, only a flat substrate is depicted herein. Additionally, the first insulating layer 200 and the second insulating layer 250 may be a single low-k dielectric layer, such as a silicon oxide layer, a silicon nitride layer, or a low-k dielectric material layer, or multi-layer dielectric structure.

A first conductive line 210 and a second conductive line 220 are disposed in the first insulating layer 200 and respectively at two sides of a dashed line 10, and surround the center region A. In one embodiment, the first and second conductive lines 210 and 220 are symmetrical with respect to the dashed line 10. The first conductive line 210 has a first end 211 and a second end 212. The second conductive line 220 has a first end 221 and a second end 222. The second end 212 of the first conductive line 210 and the second end 222 of the second conductive line 220 are coupled to each other through a conductive layer 203 disposed in an insulating layer 201. The first and second conductive lines 210 and 220 may substantially form a shape that is circular, rectangular, hexagonal, octagonal, or polygonal, respectively. To simplify the diagram, only an exemplary rectangular shape is depicted herein. Moreover, the first and second conductive lines 210 and 220 may comprise copper, aluminum, or an alloy thereof. In the embodiment, the first and second conductive lines 210 and 220 may have the same line width.

A first winding portion 300 and a second winding portion 400 are disposed in the second insulating layer 250 and respectively at two sides of a dashed line 10, and surround the center region A. In the embodiment, the first winding portion 300 comprises a third conductive line 330 and a fourth conductive line 340 arranged from the inside to the outside. The second winding portion 400 comprises a third conductive line 430 and a fourth conductive line 440 arranged from the inside to the outside. The third conductive line 330 has a first end 331 and a second end 332. The third conductive line 430 has a first end 431 and a second end 432. In one embodiment, the third conductive lines 330 and 430 near the center region A are symmetrical with respect to the dashed line 10. The fourth conductive line 340 has a first end 341 and a second end 342. The fourth conductive line 440 has a first end 441 and a second end 442. The third conductive lines 330 and 430 and the fourth conductive lines 340 and 440 may substantially form a shape that is circular, rectangular, hexagonal, octagonal, or polygonal. To simplify the diagram, only an exemplary rectangular shape is depicted herein. Moreover, the third conductive lines 330 and 430, and the fourth conductive lines 340 and 440 may comprise the same material as that of the first and second conductive lines 210 and 220. In the embodiment, the third conductive lines 330 and 430, and the fourth conductive lines 340 and 440 may have the same line width as that of the first and second conductive lines 210 and 220.

A coupling portion is disposed in the first and second insulating layers 200 and 250 between the first and second winding portions 300 and 400, and comprises a first pair of connection layers 510 and a second pair of connection layers 520. The first pair of connection layers 510 comprises an upper cross-connect layer 511 disposed in the second insulating layer 250, and a lower cross-connect layer 512 disposed in the first insulating layer 200. The second pair of connection layers 520 comprises an upper cross-connect layer 521 disposed in the second insulating layer 250, and a lower cross-connect layer 522 disposed in the first insulating layer 200.

The first end 431 of the third conductive line 430 of the second winding portion 400 is connected to the first end 211 of the first conductive line 210 through the upper cross-connect layer 511 of the first pair of connection layers 510. As shown in FIG. 1C, at least one conductive plug 515, is disposed at one side of the upper cross-connect layer 511 connecting the first end 211 so as to electrically connect to the first conductive line 210 disposed in the first insulating layer 200. It is noted that only one conductive plug 515 is illustrated in the figures of the embodiment, but it is not limited thereto.

In most embodiments, several conductive plugs 515 are disposed at the side of the upper cross-connect layer 511 connecting the first end 211. Moreover, the first end 331 of the third conductive line 330 of the second winding portion 300 is connected to the first end 211 of the second conductive line 220 through the lower cross-connect layer 512 of the first pair of connection layers 510. At least one conductive plug (not shown) is disposed at one side of the lower cross-connect layer 512 connecting the first end 331 so as to electrically connect to the third conductive line 330 disposed in the second insulating layer 250. Therefore, the first ends 331 and 431 of the third conductive lines 330 and 430 of the first winding portion 300 and second winding portion 400 are cross-connected to the first end 211 of the first conductive line 210 and the first end 221 of the second conductive line 220 through the first pair of connection layers 510.

The second end 332 of the third conductive line 330 of the first winding portion 300 is connected to the second end 442 of the fourth conductive line 440 of the second winding portion 400 through the upper cross-connect layer 521 of the second pair of connection layers 520. The second end 432 of the third conductive line 430 of the second winding portion 400 is connected to the second end 342 of the fourth conductive line 340 of the first winding portion 300 through the lower cross-connect layer 522 of the second pair of connection layers 520. At least one conductive plug, such as the conductive plug 525 illustrated in FIG. 1B, is disposed at both sides of the lower cross-connect layer 522 so as to electrically connect to the third conductive line 430 of the second winding portion 400 and the fourth conductive line 340 of the first winding portion 300. Therefore, the second ends 332 and 432 of the third conductive lines 330 and 430 are cross-connected to the second ends 342 and 442 of the fourth conductive lines 340 and 440 through the second pair of connection layers 520. It is noted that only one conductive plug 525 is illustrated in the figures of the embodiment, but it is not limited thereto. In most embodiments, several conductive plugs 525 are disposed at the side of the lower cross-connect layer 522 connecting the second end 342.

The semiconductor device having the inductor further comprises a first extending portion 610 and a second extending portion 620 disposed in the second insulating layer 250. In one embodiment, the first and second extending portions 610 and 620 are correspondingly connected to the first ends 341 and 441 of the fourth conductive lines 340 and 440 of the first winding portion 300 and second winding portion 400, and parallel to each other. In other embodiments, the first and second extending portions 610 and 620 are not parallel to each other. The first ends 341 and 441 of the fourth conductive lines 340 and 440 may be disposed at the same side of the dashed line 10 or symmetrically disposed at two sides of the dashed line 10. Therefore, the locations of the first and second extending portions 610 and 620 are adjustable within a range of a side length of the fourth conductive lines 340 and 440.

Moreover, the semiconductor device having the inductor further comprises a third extending portion 630 disposed in the first insulating layer 200 and connected to the second conductive line 220. In the embodiment, the third extending portion 630 is similar to the branch structure described in Description of the Related Art. In one embodiment, the extending direction of the first extending portion 610 is perpendicular to that of the third extending portion 630, and the extending direction of the second extending portion 620 is perpendicular to that of the third extending portion 630 as viewed from the plan view. In some embodiments, if the first and second extending portions 610 and 620 are not parallel to each other, the extending direction of the third extending portion 630 is perpendicular to the extending direction of the first extending portion 610 or the second extending portion 620. In yet another embodiment, the extending direction of the third extending portion 630 is not perpendicular to the extending directions of the first and second extending portions 610 and 620. In some embodiments, the third extending portion 630 disposed in the first insulating layer 200 may be connected to the first conductive line 210. Therefore, the locations of the first, second and third extending portions 610, 620 and 630 are the examples in the above embodiments; there are not limitations of the invention. In one embodiment, the third extending portion 630 may be connected to an electrostatic discharge device 635. In the embodiment, the electrostatic discharge device 635 is arranged at one side near the first and second extending portions 610 and 620, but it is not limited thereto. In some embodiments, the electrostatic discharge device 635 may be arranged at one side far away from the first and second extending portions 610 and 620. The location of the electrostatic discharge device 635 may be adjusted according to the layout demands by users. In addition, in the embodiments, the third extending portion 630 is near the second pair of connection layers 520, but it is not limited thereto. In some embodiments, the third extending portion 630 may be arranged within a tuning range R1 according to different demands.

In one embodiment, the first and second conductive lines 210 and 220 may overlap at least a portion of the third conductive lines 330 and 430, and extend along the third conductive lines 330 and 430 or the fourth conductive lines 340 and 440, such that the second ends 212 and 222 of the first and second conductive lines 210 and 220 are coupled to each other, and the first and second conductive lines 210 and 220 overlap at least a portion of the third conductive lines 330 and 430 or the fourth conductive lines 340 and 440. In one embodiment, the first and second conductive lines 210 and 220 extend along the third conductive lines 330 and 430, and overlap the third conductive lines 330 and 430. In another embodiment, the first and second conductive lines 210 and 220 extend along the fourth conductive lines 340 and 440, and overlap the fourth conductive lines 340 and 440, as shown in FIGS. 1A to 1C. The first and second conductive lines 210 and 220 extended along the fourth conductive lines 340 and 440 may effectively increase the coupling parameter. The second ends 212 and 222 of the first and second conductive lines 210 and 220 may be coupled to each other through the conductive layer 203 disposed in a third insulating layer 201, and at least one pair of conductive plugs 204 at two sides of the conductive layer 203, as shown in FIG. 1B.

In the process design, since the first and second conductive lines 210 and 220 (the lower conductive layers) have thicknesses typically smaller than that of the third conductive lines 330 and 430, and that of the fourth conductive lines 340 and 440 (the upper conductive layers), the conductor loss is increased. The semiconductor device having the inductor of the embodiment further comprises a multi-layer interconnect structure 202 comprising dielectric layers and conductive layers therein, as shown in FIGS. 1B and 1C. The multi-layer interconnect structure 202 is disposed between the first insulating layer 200 and the substrate 100, and overlaps the first and second conductive lines 210 and 220. The multi-layer interconnect structure 202 is connected to the first and second conductive lines 210 and 220 through at least two conductive plugs (not shown) so as to improve the quality of the inductor.

In the conventional on-chip inductor, the winding portions are typically disposed at the same level and surround the center region. Further, a first inductance, a second inductance and a coupling parameter are usually adjusted by changing the connecting location of the innermost conductive line of the winding portions and the branch structure. However, since the branch structure is limited to being located within a range of the side length of the innermost conductive line, such as a side length of a rectangular conductive line, the structure of the conventional on-chip inductor makes it difficult to meet various circuit-design demands.

Unlike the conventional on-chip inductor, the first and second conductive lines 210 and 220 of the embodiment of the invention are disposed in the first insulating layer 200, extend along the third conductive lines 330 and 430 or the fourth conductive lines 340 and 440 disposed in the second insulating layer 250, and overlap at least a portion of the third conductive lines 330 and 430 or the fourth conductive lines 340 and 440. Therefore, the coupling parameter can be increased by the overlap. Moreover, since the length of the first and second conductive lines 210 and 220 overlapping the fourth conductive lines 340 and 440 is longer than that of the first and second conductive lines 210 and 220 overlapping the third conductive lines 330 and 430, the inductance and coupling parameter are greater. As a result, the first and second conductive lines 210 and 220 may optionally overlap the third conductive lines 330 and 430 or the fourth conductive lines 340 and 440 according to the desired circuit design. Furthermore, unlike the conventional on-chip inductor having conductive lines sequentially arranged and surrounding from the outside to the inside, and forming a current path through several pairs of connection layers, the first and second conductive lines 210 and 220 originally arranged on the inside are modified to be arranged on the outside according to the invention. Namely, with respect to the center region A, the first and second conductive lines 210 and 220 are arranged outside of the third conductive lines 330 and 430, rather than the inside of the third conductive lines 330 and 430. Therefore, the problem of the branch structure being limited to being located within a range of the side length of the innermost conductive line is addressed. In other words, since the first and second conductive lines 210 and 220 partially or fully overlap the third conductive lines 330 and 430 or the fourth conductive lines 340 and 440, the tuning range R1 for the location of the third extending portion 630 is increased. Namely, the tuning range for the first inductance, the second inductance and the coupling parameter can be increased, thereby improving the circuit design flexibility of the on-chip inductors so as to obtain the desired circuit features. In addition, when the inductor designed according to the embodiments is connected to other circuits, operable frequency ranges of the other circuits can be increased.

Figure 2:
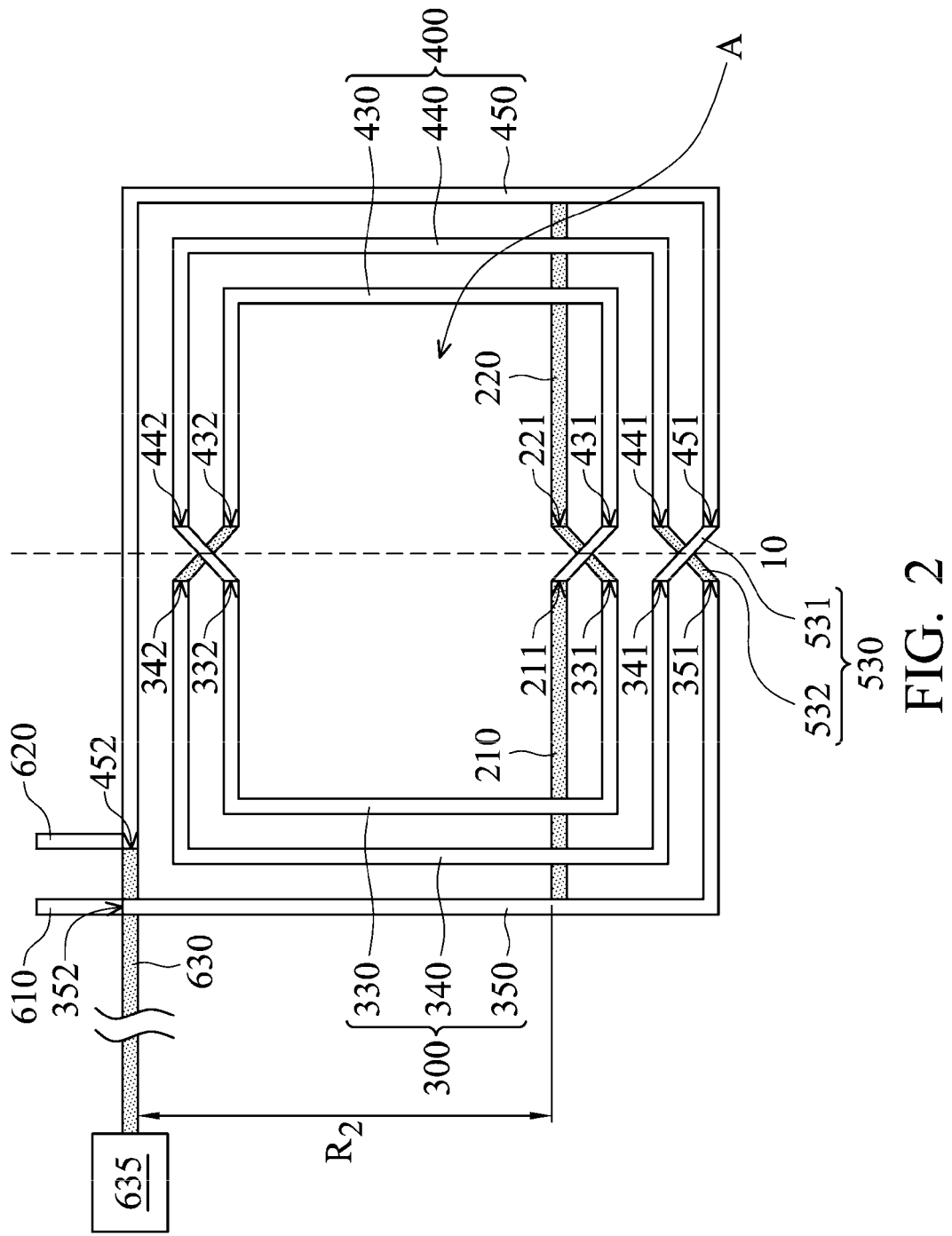
FIG. 2 is a plan view of an exemplary embodiment of a three-turn inductor according to the invention.

An exemplary embodiment of a semiconductor device having a three-turn inductor according to the invention is illustrated with FIG. 2. Elements in FIG. 2 that are the same as those in FIG. 1A are labeled with the same reference numbers as in FIG. 1A and are not described again. In FIG. 2, each of the first and second winding portions 300 and 400 further comprises a fifth conductive line 350 and a fifth conductive line 450. The fifth conductive lines 350 and 450 are outside of the fourth conductive lines 340 and 440, and have first ends 351 and 451 and second ends 352 and 452, respectively. Similarly, the fifth conductive lines 350 and 450 may have the same line width which is also the same as that of the first and second conductive lines 210 and 220. The fifth conductive lines 350 and 450 may have the same material and shape as that of the first and second conductive lines 210 and 220.

Moreover, in the embodiment, the coupling portion further comprises a third pair of connection layers 530 comprising an upper cross-connect layer 531 disposed in the second insulating layer 250, and a lower cross-connect layer 532 disposed in the first insulating layer 200. However, there is no similar element with the conductive layer 203 disposed in an insulating layer shown in FIGS. 1A and 1B. The first end 341 of the fourth conductive line 340 of the first winding portion 300 is connected to the first end 451 of the fifth conductive line 450 of the second winding portion 400 through the upper cross-connect layer 531 of the third pair of connection layers 530. The first end 441 of the fourth conductive line 440 of the second winding portion 400 is connected to the first end 351 of the fifth conductive line 350 of the first winding portion 300 through the lower cross-connect layer 532 of the third pair of connection layers 530. At least one conductive plug (not shown) is disposed at both sides of the lower cross-connect layer 532 so as to electrically connect to the fourth and fifth conductive lines 440 and 350 disposed in the second insulating layer 250. Therefore, the first ends 341 and 441 of the fourth conductive lines 340 and 440 are cross-connected to the first ends 351 and 451 of the fifth conductive lines 350 and 450 through the third pair of connection layers 530.

In the embodiment, the first and second conductive lines 210 and 220 may overlap at least a portion of the third conductive lines 330 and 430, and extend along the third conductive lines 330 and 430, the fourth conductive lines 340 and 440 or the fifth conductive lines 350 and 450, such that the second ends 212 and 222 of the first and second conductive lines 210 and 220 are coupled to each other and the first and second conductive lines 210 and 220 overlap at least a portion of the third conductive lines 330 and 430, the fourth conductive lines 340 and 440 or the fifth conductive lines 350 and 450. In the aforementioned several embodiments, the first and second conductive lines 210 and 220 extended along the fifth conductive lines 350 and 450 may effectively increase the coupling parameter.

In the embodiment, the first and second extending portions 610 and 620 are disposed in the second insulating layer 250, as shown in FIG. 1B or 1C. In one embodiment, the first and second extending portions 610 and 620 are correspondingly connected to the second ends 352 and 452 of the fifth conductive lines 350 and 450, and parallel to each other. In other embodiments, the first and second extending portions 610 and 620 are not parallel to each other. In one embodiment, the extending directions of the first and second extending portions 610 and 620 are perpendicular to that of the third extending portion 630 as viewed from a plan view. In other embodiments, if the first and second extending portions 610 and 620 are not parallel to each other, the extending direction of the third extending portion 630 is perpendicular to the extending direction of the first extending portion 610 or the second extending portion 620. In yet another embodiment, the extending direction of the third extending portion 630 is not perpendicular to the extending directions of the first and second extending portions 610 and 620. In the embodiment, the third extending portion 630 is near the first and second extending portions 610 and 620, but it is not limited thereto. In other embodiments, the third extending portion 630 may be arranged within a tuning range R2 according to different demands. Therefore, the locations of the first, second and third extending portions 610, 620 and 630 are the examples in the above embodiments; there are not limitations of the invention. Moreover, other odd-turn symmetrical inductors may have a structure similar to the inductor as shown in FIG. 2.

In the conventional on-chip inductor, since the branch structure is limited to be located within a range of the side length of the innermost conductive line, such as a side length of a rectangular conductive line, the structure of the conventional on-chip inductor is difficult to meet various circuit design demands.

Unlike the conventional on-chip inductor, the first and second conductive lines 210 and 220 of the embodiment of the invention are disposed in the first insulating layer 200, extend along the third conductive lines 330 and 430, the fourth conductive lines 340 and 440 or the fifth conductive lines 350 and 450 disposed in the second insulating layer 250, and overlap at least a portion of the third conductive lines 330 and 430, the fourth conductive lines 340 and 440 or the fifth conductive lines 350 and 450. Therefore, the coupling parameter can be increased by the overlap. Moreover, the longer the overlapping length of the conductive line, the greater the inductance and coupling parameter. Therefore, the first and second conductive lines 210 and 220 may optionally overlap one of the third conductive lines 330 and 430, the fourth conductive lines 340 and 440 and the fifth conductive lines 350 and 450 according to the desired circuit design. Further, the first and second conductive lines 210 and 220 originally arranged inside of the third conductive lines 330 and 430 are modified to be arranged outside thereof. Since the first and second conductive lines 210 and 220 partially or fully overlap the third conductive lines 330 and 430, the fourth conductive lines 340 and 440 or the fifth conductive lines 350 and 450, the tuning range R2 of the location of the third extending portion 630 is increased. Namely, the tuning range of the first inductance, the second inductance and the coupling parameter can be increased, thereby improving the circuit design flexibility of the on-chip inductors so as to obtain the desired circuit features.

Figure 3:
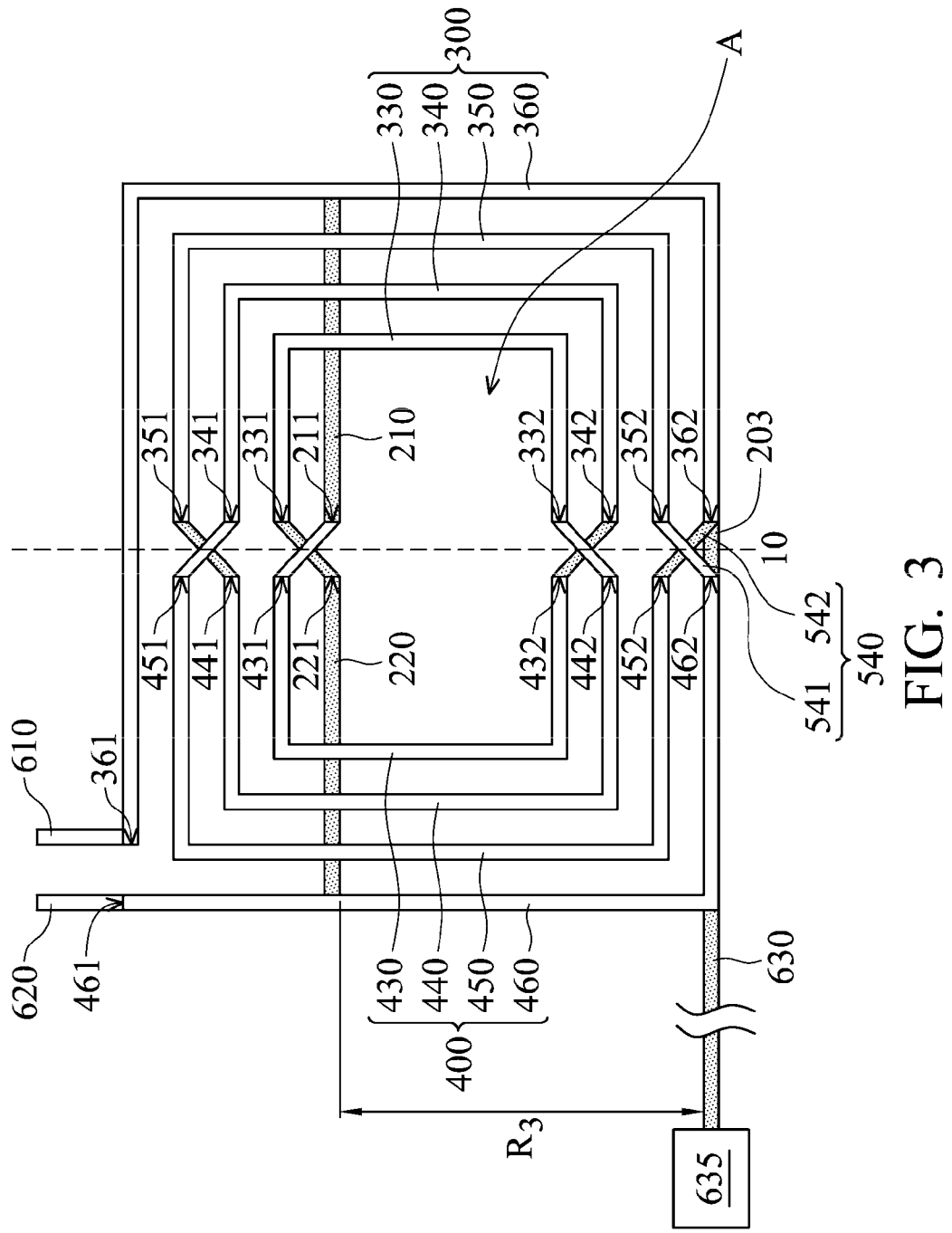
FIG. 3 is a plan view of an exemplary embodiment of a four-turn inductor according to the invention.

An exemplary embodiment of a semiconductor device having a four-turn inductor according to the invention is illustrated with FIG. 3. Elements in FIG. 3 that are the same as those in FIG. 1A are labeled with the same reference numbers as in FIG. 1A and are not described again. In FIG. 3, each of the first and second winding portions 300 and 400 further comprises a sixth conductive line 360 and a sixth conductive line 460. The sixth conductive lines 360 and 460 are outside of the fifth conductive lines 350 and 450, and have first ends 361 and 461 and second ends 362 and 462, respectively. Similarly, the sixth conductive lines 360 and 460 may have the same line width which is also the same as that of the first and second conductive lines 210 and 220. The sixth conductive lines 360 and 460 may have the same material and shape as that of the first and second conductive lines 210 and 220.

Moreover, in the embodiment, the coupling portion further comprises a fourth pair of connection layers 540 comprising an upper cross-connect layer 541 disposed in the second insulating layer 250, and a lower cross-connect layer 542 disposed in the first insulating layer 200. The second end 352 of the fifth conductive line 350 of the first winding portion 300 is connected to the second end 462 of the sixth conductive line 460 of the second winding portion 400 through the upper cross-connect layer 541 of the fourth pair of connection layers 540. The second end 452 of the fifth conductive line 450 of the second winding portion 400 is connected to the second end 362 of the sixth conductive line 360 of the first winding portion 300 through the lower cross-connect layer 542 of the fourth pair of connection layers 540. At least one conductive plug (not shown) is disposed at both sides of the lower cross-connect layer 542 so as to electrically connect to the fifth and sixth conductive lines 450 and 360 disposed in the second insulating layer 250. Therefore, the second ends 352 and 452 of the fifth conductive lines 350 and 450 are cross-connected to the second ends 362 and 462 of the sixth conductive lines 360 and 460 through the fourth pair of connection layers 540.

In the embodiment, the first and second conductive lines 210 and 220 may overlap at least a portion of the third conductive lines 330 and 430, and extend along the third conductive lines 330 and 430, the fourth conductive lines 340 and 440, the fifth conductive lines 350 and 450 or the sixth conductive lines 360 and 460, such that the second ends 212 and 222 of the first and second conductive lines 210 and 220 are coupled to each other, and the first and second conductive lines 210 and 220 overlap at least a portion of the third conductive lines 330 and 430, the fourth conductive lines 340 and 440, the fifth conductive lines 350 and 450 or the sixth conductive lines 360 and 460. In the aforementioned several embodiments, the first and second conductive lines 210 and 220 extended along the sixth conductive lines 360 and 460 may effectively increase the coupling parameter In the embodiment, the first and second extending portions 610 and 620 are disposed in the second insulating layer 250, as shown in FIG. 1B or 1C. In one embodiment, the first and second extending portions 610 and 620 are correspondingly connected to the first ends 361 and 461 of the sixth conductive lines 360 and 460, and are parallel to each other. In other embodiments, the first and second extending portions 610 and 620 are not parallel to each other. In one embodiment, the extending directions of the first and second extending portions 610 and 620 are perpendicular to that of the third extending portion 630 as viewed from a plan view. In other embodiments, if the first and second extending portions 610 and 620 are not parallel to each other, the extending direction of the third extending portion 630 is perpendicular to the extending direction of the first extending portion 610 or the second extending portion 620. In yet another embodiment, the extending direction of the third extending portion 630 is not perpendicular to the extending directions of the first and second extending portions 610 and 620. In the embodiment, the third extending portion 630 is near the fourth pair of connection layers 540, but it is not limited thereto. In other embodiments, the third extending portion 630 may be arranged within a tuning range R3 according to different demands. Therefore, the locations of the first, second and third extending portions 610, 620 and 630 are the examples in the above embodiments; there are not limitations of the invention. Moreover, other even-turn symmetrical inductors may have a structure similar to the inductor as shown in FIG. 3.

In the conventional on-chip inductor, since the branch structure is limited to be located within a range of the side length of the innermost conductive line, such as a side length of a rectangular conductive line, the structure of the conventional on-chip inductor is difficult to meet various circuit design demands.

Unlike the conventional on-chip inductor, the first and second conductive lines 210 and 220 of the embodiment of the invention are disposed in the first insulating layer 200, extend along the third conductive lines 330 and 430, the fourth conductive lines 340 and 440, the fifth conductive lines 350 and 450 or the sixth conductive lines 360 and 460 disposed in the second insulating layer 250, and overlap at least a portion of the third conductive lines 330 and 430, the fourth conductive lines 340 and 440, the fifth conductive lines 350 and 450 or the sixth conductive lines 360 and 460. Therefore, the coupling parameter can be increased by the overlap. Moreover, the longer the overlapping length of the conductive line, the greater the inductance and coupling parameter. Therefore, the first and second conductive lines 210 and 220 may optionally overlap one of the third conductive lines 330 and 430, fourth conductive lines 340 and 440, fifth conductive lines 350 and 450 and sixth conductive lines 360 and 460 according to the desired circuit design. Further, the first and second conductive lines 210 and 220 originally arranged inside of the third conductive lines 330 and 430 are modified to be arranged outside thereof. Since the first and second conductive lines 210 and 220 partially or fully overlap the third conductive lines 330 and 430, the fourth conductive lines 340 and 440, the fifth conductive lines 350 and 450 or the sixth conductive lines 360 and 460, the tuning range R3 for the location of the third extending portion 630 is increased. Namely, the tuning range for the first inductance, the second inductance and the coupling parameter can be increased, thereby improving the circuit design flexibility of the on-chip inductors so as to obtain the desired circuit features.

In addition, those skilled in the art will realize that the aforementioned embodiments of the invention can be implemented to more than just four-turn symmetrical inductors and the same advantages can be obtained.

Figure 4A:
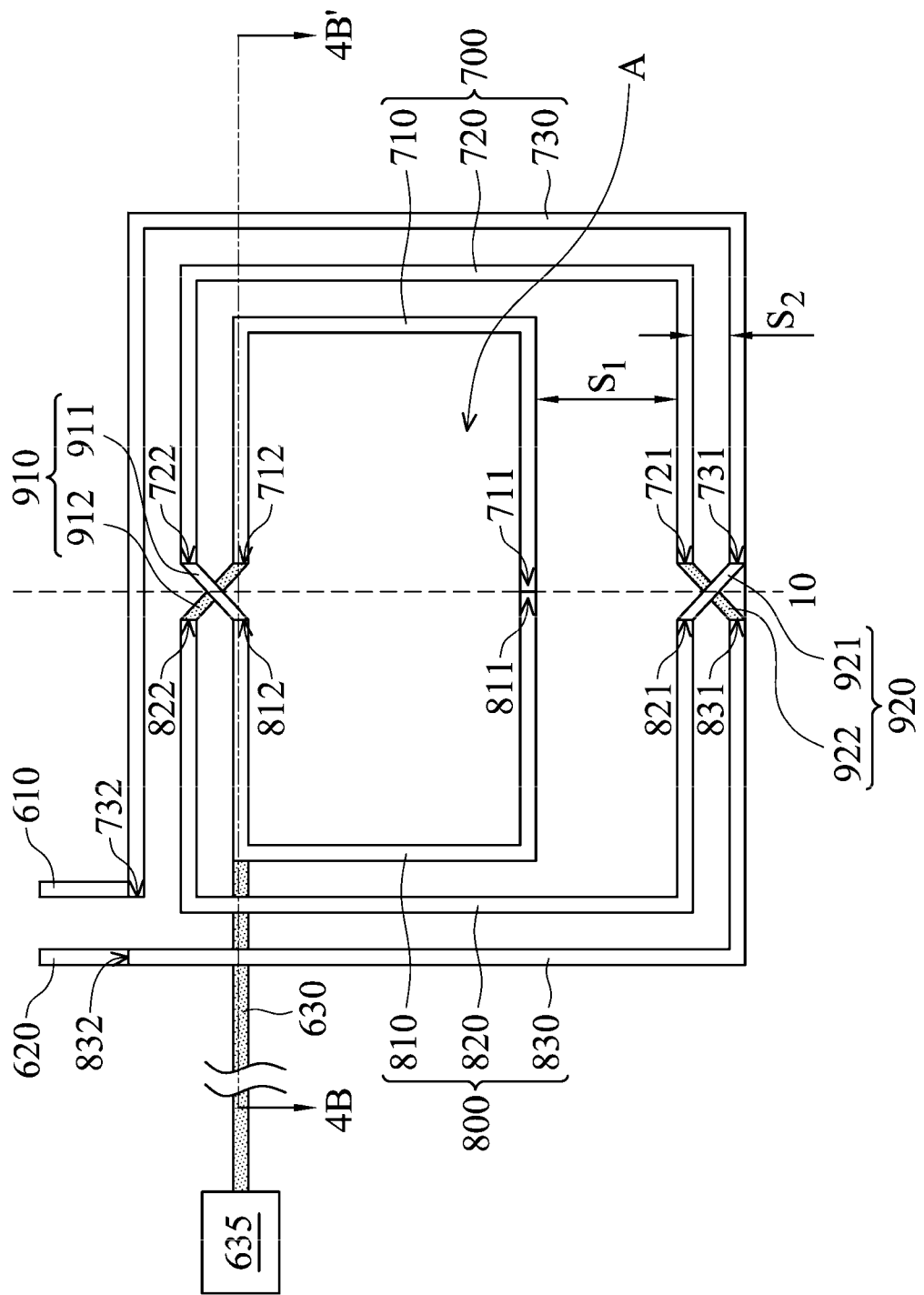
FIG. 4A is a plan view of another exemplary embodiment of a three-turn inductor according to the invention.
Figure 4B:
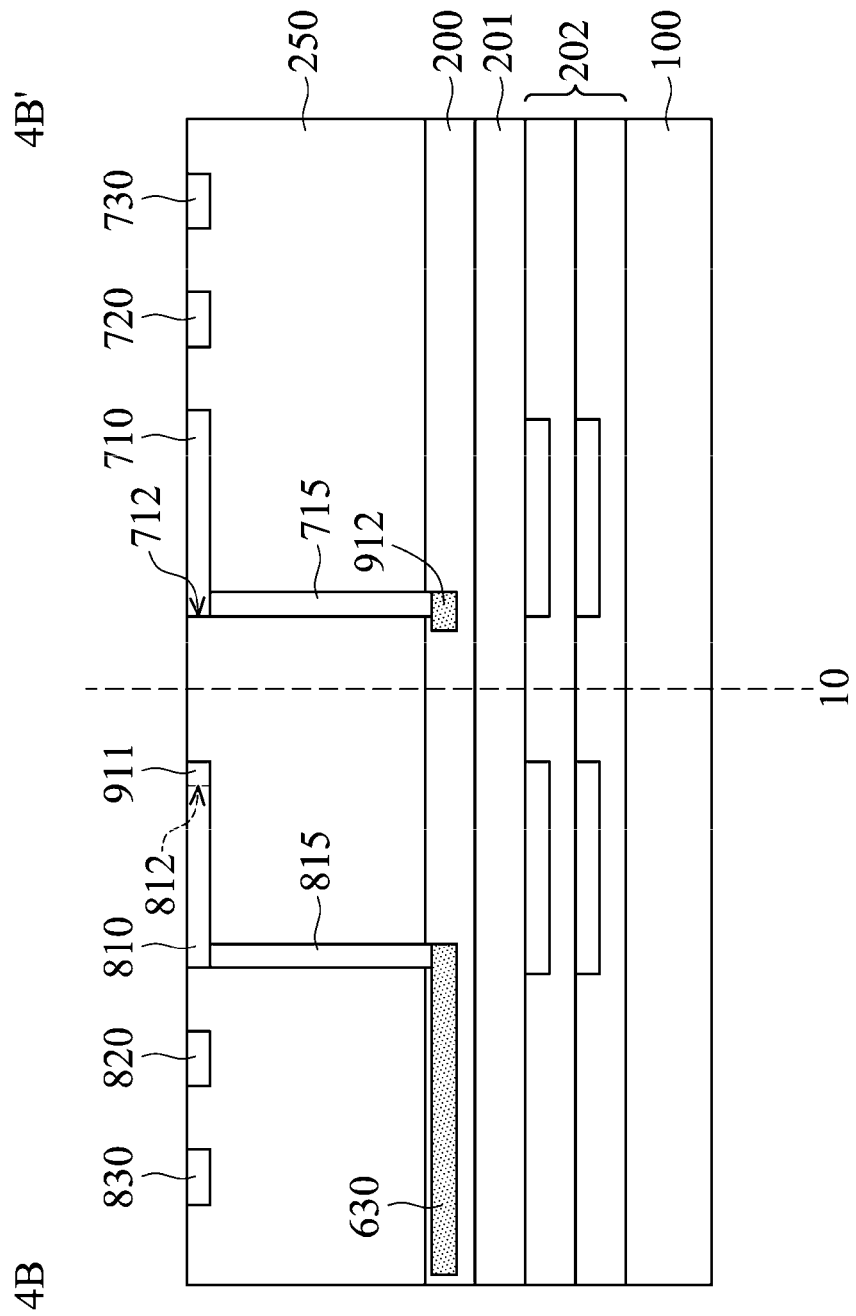
FIG. 4B is a cross-sectional view along the line 4B-4B' in FIG. 4A.
Figure 6:
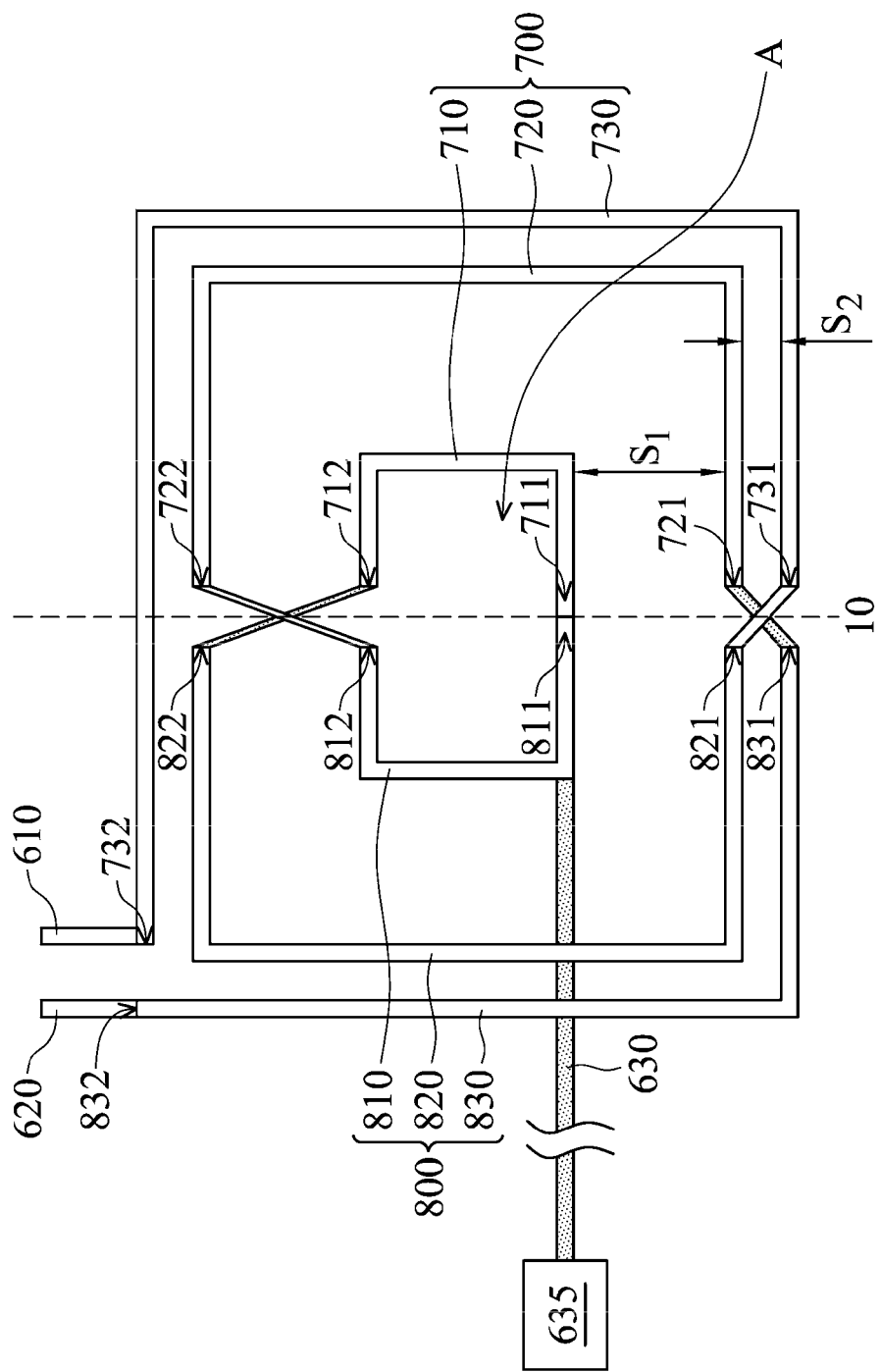
FIG. 6 is a plan view of yet another exemplary embodiment of a three-turn inductor according to the invention.

Another exemplary embodiment of a semiconductor device having a three-turn inductor according to the invention is illustrated with FIGS. 4A, 4B and 6, in which FIG. 4A is a plan view of a three-turn inductor, FIG. 4B is a cross-sectional view along the line 4B-4B' in FIG. 4A and FIG. 6 is a plan view of yet another exemplary embodiment of a semiconductor device having a three-turn inductor according to the invention.

A semiconductor device having a three-turn inductor comprises a substrate 100 having a center region A, as shown in FIG. 4A. A first insulating layer 200 and a second insulating layer 250 are sequentially disposed on the substrate 100, as shown in FIG. 4B. The substrate 100 may include a silicon substrate or other semiconductor substrates well known in the art. The substrate 100 may comprise various elements, such as transistors, resistors, or other semiconductor elements well known in the art. Moreover, the substrate 100 may also include other conductive layers, such as copper, aluminum, or an alloy thereof, and other insulating layers, such as silicon oxide, silicon nitride, or low-k dielectric material. To simplify the diagram, only a flat substrate is depicted herein. Additionally, the first insulating layer 200 and the second insulating layer 250 may be a single low-k dielectric layer, such as a silicon oxide layer, a silicon nitride layer, or a low-k dielectric material layer, or multi-layer dielectric structure.

A first winding portion 700 and a second winding portion 800 are disposed in the second insulating layer 250 and respectively at two sides of a dashed line 10, and surround the center region A. The first winding portion 700 comprises a first conductive line 710, a second conductive line 720 and a third conductive line 730 arranged from the inside to the outside. The second winding portion 800 comprises a first conductive line 810, a second conductive line 820 and a third conductive line 830 arranged from the inside to the outside. In the embodiment, the first conductive lines 710 and 810 are symmetrical with respect to the dashed line 10. In the embodiment, the second conductive lines 720 and 820 are symmetrical with respect to the dashed line 10. The first conductive line 710 has a first end 711 and a second end 712. The first conductive line 810 has a first end 811 and a second end 812. The second conductive line 720 has a first end 721 and a second end 722. The second conductive line 820 has a first end 821 and a second end 822. The third conductive line 730 has a first end 731 and a second end 732. The third conductive line 830 has a first end 831 and a second end 832. In the embodiment, the first end 711 of the first conductive line 710 of the first winding portion 700 and the first end 811 of the first conductive line 810 of the second winding portion 800 are coupled to each other.

The first conductive lines 710 and 810, the second conductive lines 720 and 820 or the third conductive lines 830 and 830 of the first and second winding portions 700 and 800 may substantially form a shape that is circular, rectangular, hexagonal, octagonal, or polygonal. To simplify the diagram, only an exemplary rectangular shape is depicted herein. Moreover, the first conductive lines 710 and 810, the second conductive lines 720 and 820 and the third conductive lines 830 and 830 may comprise the same material, such as copper, aluminum or alloy thereof. In the embodiment, the first conductive lines 710 and 810, the second conductive lines 720 and 820 and the third conductive lines 830 and 830 may have the same line width.

A coupling portion is disposed in the first and second insulating layers 200 and 250 between the first and second winding portions 700 and 800, and comprises a first pair of connection layers 910 and a second pair of connection layers 920. The first pair of connection layers 910 comprises an upper cross-connect layer 911 disposed in the second insulating layer 250, and a lower cross-connect layer 912 disposed in the first insulating layer 200. The second pair of connection layers 920 comprises an upper cross-connect layer 921 disposed in the second insulating layer 250, and a lower cross-connect layer 922 disposed in the first insulating layer 200.

The second end 722 of the second conductive line 720 of the first winding portion 700 is connected to the second end 812 of the first conductive line 810 of the second winding portion 800 through the upper cross-connect layer 911 of the first pair of connection layers 910. Moreover, the second end 822 of the second conductive line 820 of the second winding portion 800 is connected to the second end 712 of the first conductive line 710 of the first winding portion 700 through the lower cross-connect layer 912 of the first pair of connection layers 910. At least one conductive plug, such as the conductive plug 715 illustrated in FIG. 4B, is disposed at both sides of the lower cross-connect layer 912 so as to electrically connect to the first and second conductive lines 710 and 820 disposed in the second insulating layer 250. Therefore, the second ends 712 and 812 of the first conductive lines 710 and 810 are cross-connected to the second ends 722 and 822 of the second conductive lines 720 and 820 through the first pair of connection layers 910. It is noted that only one conductive plug 715 is illustrated in the figures of the embodiment, but it is not limited thereto. In most embodiments, several conductive plugs 715 are disposed at one side of the lower cross-connect layer 912 connecting the second end 712.

The first end 731 of the third conductive line 730 of the first winding portion 700 is connected to the first end 821 of the second conductive line 820 of the second winding portion 800 through the upper cross-connect layer 921 of the second pair of connection layers 920. Moreover, the first end 831 of the third conductive line 830 of the second winding portion 800 is connected to the first end 721 of the second conductive line 720 of the first winding portion 700 through the lower cross-connect layer 922 of the second pair of connection layers 920. At least one conductive plug (not shown) is disposed at both sides of the lower cross-connect layer 922 so as to electrically connect to the second and third conductive lines 720 and 330 disposed in the second insulating layer 250. Therefore, the first ends 721 and 821 of the second conductive lines 720 and 820 are cross-connected to the first ends 731 and 831 of the third conductive lines 730 and 830 through the second pair of connection layers 920.

The semiconductor device having the inductor further comprises a first extending portion 610 and a second extending portion 620 disposed in the second insulating layer 250. In one embodiment, the first and second extending portions 610 and 620 are correspondingly connected to the second ends 732 and 832 of the third conductive lines 730 and 830, and parallel to each other. In some embodiments, the first and second extending portions 610 and 620 are not parallel to each other. The second ends 732 and 832 of the third conductive lines 730 and 830 may be disposed at the same side of the dashed line 10 or symmetrically disposed at two sides of the dashed line 10. Therefore, the locations of the first and second extending portions 610 and 620 are adjustable within a range of the side length of the third conductive lines 730 and 830.

Moreover, the semiconductor device having the inductor further comprises a third extending portion 630 disposed in the first insulating layer 200 and connected to the first conductive line 810 of the second winding portion 800 through at least one conductive plug 815, as shown in FIG. 4B. In the embodiment, the third extending portion 630 is similar to the branch structure described in the Description of the Related Art. It is noted that only one conductive plug 815 is illustrated in the figures of the embodiment, but it is not limited thereto. In most embodiments, several conductive plugs 815 are disposed at one side of the third extending portion 630 connecting the first conductive line 810 of the second winding portion 800. In addition, the extending directions of the first and second extending portions 610 and 620 are perpendicular to that of the third extending portion 630 as viewed from a plan view. In some embodiments, if the first and second extending portions 610 and 620 are not parallel to each other, the extending direction of the third extending portion 630 is perpendicular to the extending direction of the first extending portion 610 or the second extending portion 620. In yet another embodiment, the extending direction of the third extending portion 630 is not perpendicular to the extending directions of the first and second extending portions 610 and 620. In some embodiments, the third extending portion 630 may be connected to the first conductive line 710 of the first winding portion 700 through conductive plugs. In one embodiment, the third extending portion 630 may be connected to an electrostatic discharge device 635. In the embodiment, the electrostatic discharge device 635 is arranged at one side near the first and second extending portions 610 and 620, but it is not limited thereto. In some embodiments, the electrostatic discharge device 635 may be arranged at one side far away from the first and second extending portions 610 and 620. The location of the electrostatic discharge device 635 may be adjusted according to the layout demands by users. In addition, in the embodiments, the third extending portion 630 is near the first and second extending portions 610 and 620, but it is not limited thereto. In some embodiments, the third extending portion 630 may be arranged within a range of a side length of the innermost conductive line, such as the first conductive line 710 or the first conductive line 810, according to different demands. Therefore, the locations of the first, second and third extending portions 610, 620 and 630 are the examples in the above embodiments; there are not limitations of the invention.

In the embodiment, the semiconductor device having the inductor of the embodiment further comprises a multi-layer interconnect structure 202 comprising dielectric layers and conductive layers therein, as shown in FIG. 4B. The multi-layer interconnect structure 202 is disposed between the first insulating layer 200 and the substrate 100, and overlaps the first conductive lines 710 and 810. The multi-layer interconnect structure 202 is connected to the first conductive lines 710 and 810 through at least two conductive plugs (not shown) so as to improve the quality of the inductor.

In one embodiment, a plurality of spacings between the first conductive lines 710 and 810 and the second conductive lines 720 and 820 adjacent thereto are different, in which at least one spacing S1 is greater than the spacing S2 between the second conductive lines 720 and 820 and the third conductive lines 730 and 830 adjacent thereto, as shown in FIG. 4A. In detail, the first winding portion 700 and the second winding portion 800 shown in FIG. 4A substantially form a rectangular shape, and only the spacing S1 at one side is greater than the spacing S2 between the second conductive lines 720 and 820 and the third conductive lines 730 and 830 adjacent thereto. In one embodiment, a plurality of spacings between the first conductive lines 710 and 810 and the second conductive lines 720 and 820 adjacent thereto are the same spacing S1 greater than the spacing S2 between the second conductive lines 720 and 820 and the third conductive lines 730 and 830 adjacent thereto, as shown in FIG. 6. In detail, the first winding portion 700 and the second winding portion 800 shown in FIG. 6 substantially form a rectangular shape, and the spacings S1 at four sides are greater than the spacing S2 between the second conductive lines 720 and 820 and the third conductive lines 730 and 830 adjacent thereto.

Moreover, other odd-turn symmetrical inductors may have a structure similar to the inductor as shown in FIGS. 4A, 4B and 6.

Figure 5:
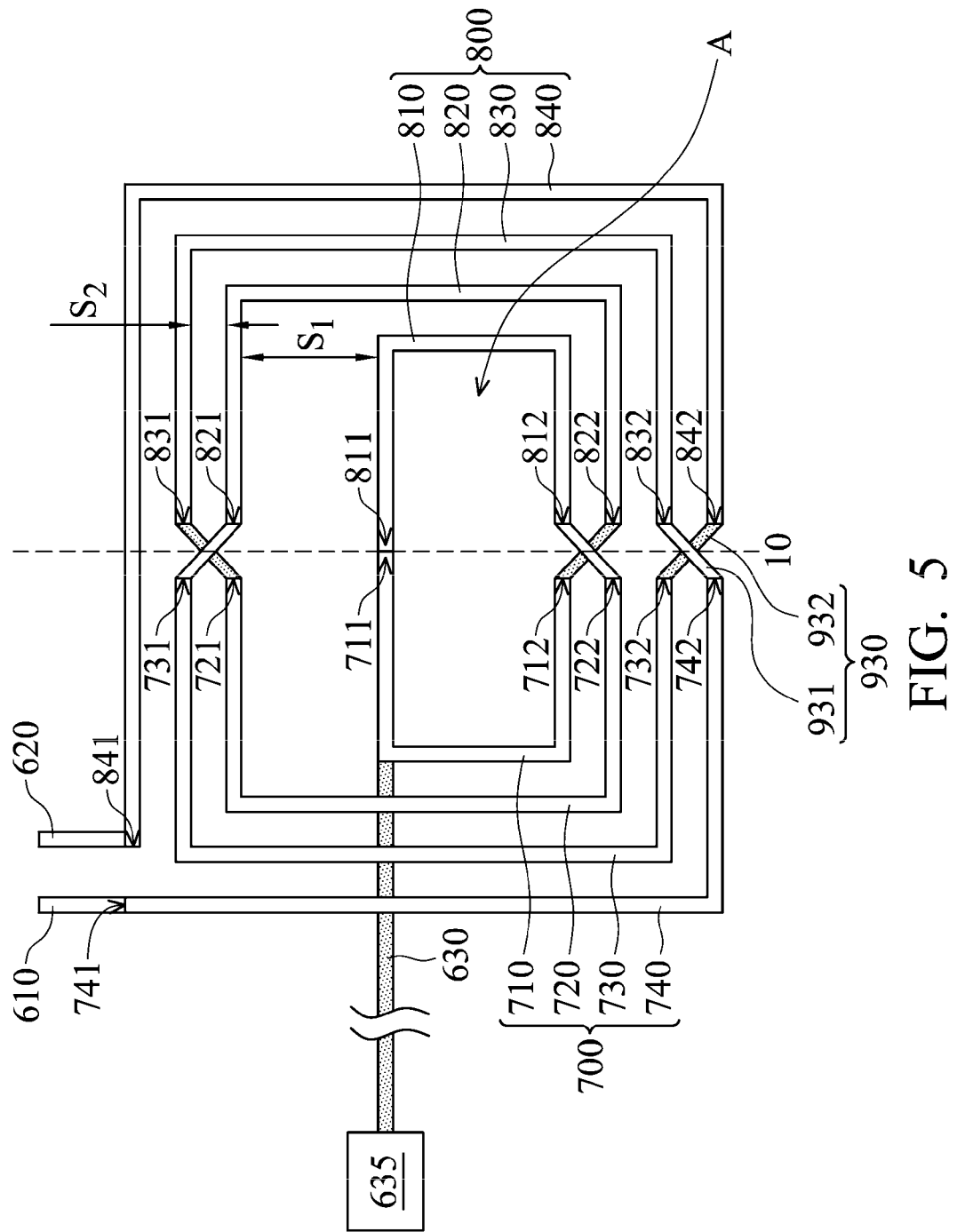
FIG. 5 is a plan view of another exemplary embodiment of a four-turn inductor according to the invention.
Figure 7:
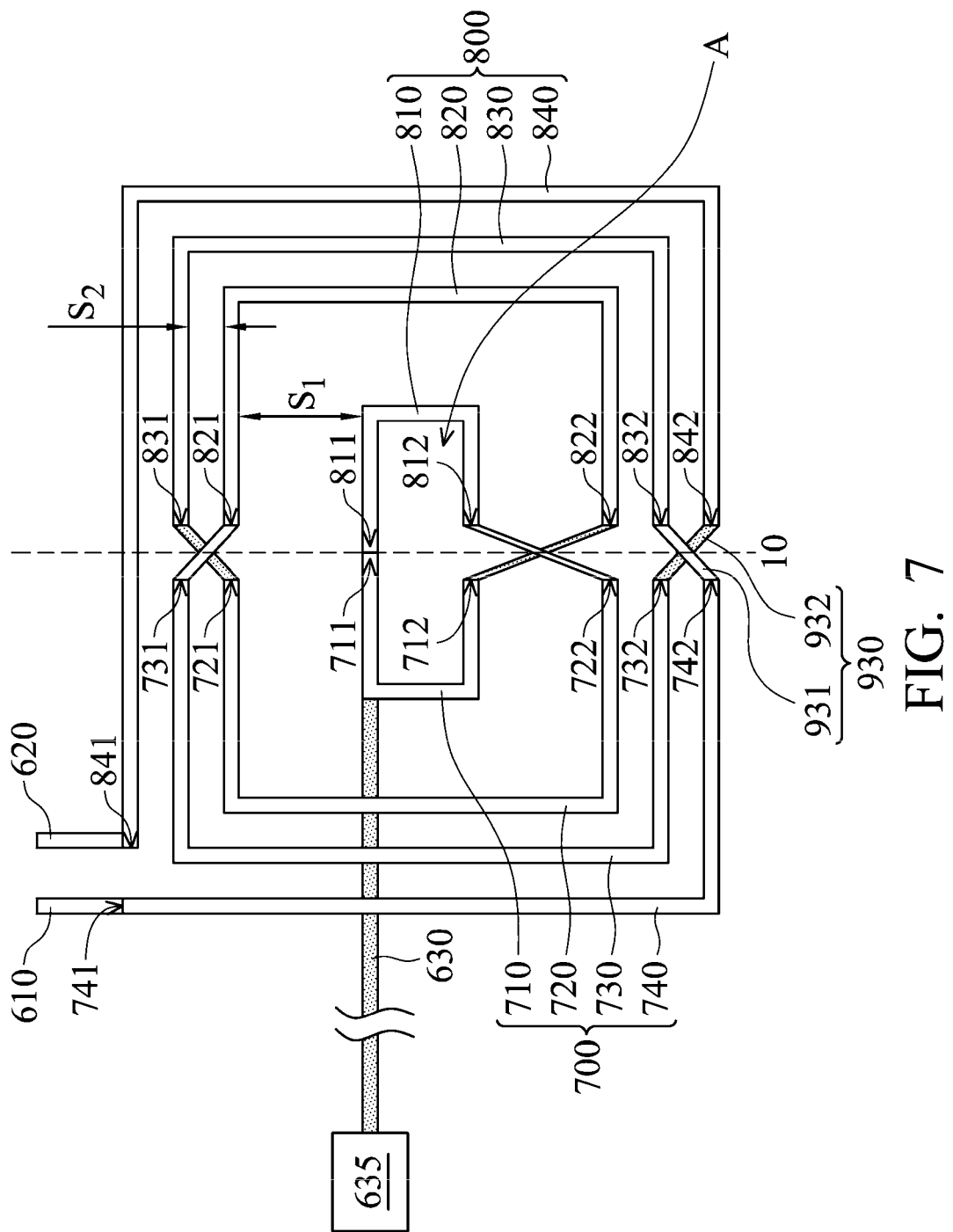
FIG. 7 is a plan view of yet another exemplary embodiment of a four-turn inductor according to the invention.

Another exemplary embodiment of a semiconductor device having a four-turn inductor according to the invention is illustrated with FIGS. 5 and 7. Elements in FIGS. 5 and 7 that are the same as those in FIGS. 4A, 4B and 6 are labeled with the same reference numbers as in FIGS. 4A, 4B and 6 and are not described again. In FIG. 5, the first winding portion 700 further comprises a fourth conductive line 740 outside of the third conductive line 730 and having a first end 741 and a second end 742. The second winding portion 800 further comprises a fourth conductive line 840 outside of the third conductive line 830 and having a first end 841 and a second end 842. Similarly, the fourth conductive lines 740 and 840 of the first and second winding portions 700 and 800 may have the same line width which is also the same as that of the first conductive lines 710 and 810, the second conductive lines 720 and 820 and the third conductive lines 730 and 830. The fourth conductive lines 740 and 840 may have the same material and shape as that of the first conductive lines 710 and 810, the second conductive lines 720 and 820 and the third conductive lines 730 and 830.

Moreover, in the embodiment, the coupling portion further comprises a third pair of connection layers 930 comprising an upper cross-connect layer 931 disposed in the second insulating layer 250, and a lower cross-connect layer 932 disposed in the first insulating layer 200. The second end 742 of the fourth conductive line 740 of the first winding portion 700 is connected to the second end 832 of the third conductive line 830 of the second winding portion 800 through the upper cross-connect layer 931 of the third pair of connection layers 930. Moreover, the second end 732 of the third conductive line 730 of the first winding portion 700 is connected to the second end 842 of the fourth conductive line 840 of the second winding portion 800 through the lower cross-connect layer 932 of the third pair of connection layers 930. At least one conductive plug (not shown) is disposed at both sides of the lower cross-connect layer 932 so as to electrically connect to the third and fourth conductive lines 730 and 840 disposed in the second insulating layer 250. Therefore, the second ends 732 and 832 of the third conductive lines 730 and 830 are cross-connected to the second ends 742 and 842 of the fourth conductive lines 740 and 840 through the third pair of connection layers 930.

In the embodiment, the first and second extending portions 610 and 620 are disposed in the second insulating layer 250, as shown in FIG. 4B. In one embodiment, the first and second extending portions 610 and 620 are correspondingly connected to the first ends 741 and 841 of the fourth conductive lines 740 and 840, and parallel to each other. In some embodiments, the first and second extending portions 610 and 620 are not parallel to each other. In one embodiment, the extending directions of the first and second extending portions 610 and 620 are perpendicular to that of the third extending portion 630 as viewed from a plan view. In some embodiments, if the first and second extending portions 610 and 620 are not parallel to each other, the extending direction of the third extending portion 630 is perpendicular to the extending direction of the first extending portion 610 or the second extending portion 620. In yet another embodiment, the extending direction of the third extending portion 630 is not perpendicular to the extending directions of the first and second extending portions 610 and 620. In some embodiments, the third extending portion 630 may be arranged within a range of a side length of the innermost conductive line, such as the first conductive line 710 or the first conductive line 810, according to different demands. Therefore, the locations of the first, second and third extending portions 610, 620 and 630 are the examples in the above embodiments; there are not limitations of the invention. Moreover, other even-turn symmetrical inductors may have a structure similar to the inductor as shown in FIGS. 5 and 7.

Unlike the conventional on-chip inductor, in the embodiment of the invention, a plurality of spacings between the first conductive lines 710 and 810 and the second conductive lines 720 and 820 adjacent thereto are the same or different, in which at least one spacing S1 is greater than the spacing S2 between the second conductive lines 720 and 820 and the third conductive lines 730 and 830 adjacent thereto. In detail, as shown in FIG. 5, the first winding portion 700 and the second winding portion 800 substantially form a rectangular shape, and only the spacing S1 at one side is greater than the spacing S2 between the second conductive lines 720 and 820 and the third conductive lines 730 and 830 adjacent thereto. As shown in FIG. 7, the first winding portion 700 and the second winding portion 800 substantially form a rectangular shape, and the spacings S1 at four sides are greater than the spacing S2 between the second conductive lines 720 and 820 and the third conductive lines 730 and 830 adjacent thereto. Therefore, the coupling parameter can be reduced by increasing the spacing. Moreover, the wiring length of the first inductance or the second inductance can be changed by adjusting the spacings between the second conductive lines 720 and 820 and the third conductive lines 730 and 830 adjacent thereto, thereby unilaterally adjusting the first inductance value or the second inductance value. Therefore, the circuit design flexibility can be increased and the difficulty in adjustment of the circuit parameters can be reduced so as to easily obtain the desired circuit features.

In addition, those skilled in the art will realize that the aforementioned embodiments of the invention can be implemented to more than just four-turn symmetrical inductors and the same advantages can be obtained.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a first insulating layer and a second insulating layer sequentially disposed on a substrate having a center region;
   a first conductive line and a second conductive line disposed in the first insulating layer and surrounding the center region, wherein each of the first and second conductive lines has a first end and a second end, and wherein the second ends of the first and second conductive lines are coupled to each other;
   a first winding portion and a second winding portion disposed in the second insulating layer and surrounding the center region, wherein each of the first and second winding portions comprises a third conductive line and a fourth conductive line arranged from the inside to the outside with respect to the center region, and wherein each of the third and fourth conductive lines has a first end and a second end; and
   a coupling portion disposed in the first and second insulating layers between the first winding portion and the second winding portion, and comprising:
      a first pair of connection layers cross-connecting the first ends of the third conductive lines and the first ends of the first and second conductive lines; and
      a second pair of connection layers cross-connecting the second ends of the third and fourth conductive lines,
   wherein the first and second conductive lines overlap at least a portion of each of the third conductive lines, and wherein a remaining portion of each of the third conductive lines does not overlap the first and second conductive lines and an area of the overlapping portion is less than that of the remaining portion.

2. The semiconductor device as claimed in claim 1, wherein the first and second conductive lines extend along the third or fourth conductive lines, such that the second ends of the first and second conductive lines are coupled to each other, and the first and second conductive lines overlap at least a portion of the third or fourth conductive lines.

3. The semiconductor device as claimed in claim 1, wherein each of the first pair of connection layers and the second pair of connection layers comprises two cross-connect layers respectively disposed in the first insulating layer and the second insulating layer.

4. The semiconductor device as claimed in claim 1, further comprising a third extending portion disposed in the first insulating layer and connected to the first or second conductive line.

5. The semiconductor device as claimed in claim 4, wherein the third extending portion is connected to an electrostatic discharge device.

6. The semiconductor device as claimed in claim 4, further comprising a first extending portion and a second extending portion disposed in the second insulating layer, wherein the first and second extending portions are correspondingly connected to the first ends of the fourth conductive lines and parallel to each other, and wherein extending directions of the first and second extending portions are perpendicular to that of the third extending portion.

7. The semiconductor device as claimed in claim 1, wherein each of the first and second winding portions further comprises a fifth conductive line outside of the fourth conductive line and having a first end and a second end, and wherein the coupling portion further comprises a third pair of connection layers cross-connecting the first ends of the fourth and fifth conductive lines.

8. The semiconductor device as claimed in claim 7, wherein the first and second conductive lines extend along the third, fourth or fifth conductive lines, such that the second ends of the first and second conductive lines are coupled to each other, and the first and second conductive lines overlap at least a portion of the third, fourth or fifth conductive lines.

9. The semiconductor device as claimed in claim 7, further comprising:
- a first extending portion and a second extending portion disposed in the second insulating layer, wherein the first and second extending portions are correspondingly connected to the second ends of the fifth conductive lines and parallel to each other; and
- a third extending portion disposed in the first insulating layer and connected to the first or second conductive line, wherein extending directions of the first and second extending portions are perpendicular to that of the third extending portion.

10. The semiconductor device as claimed in claim 7, wherein each of the first and second winding portions further comprises a sixth conductive line outside of the fifth conductive line and having a first end and a second end, and wherein the coupling portion further comprises a fourth pair of connection layers cross-connecting the second ends of the fifth and sixth conductive lines.

11. The semiconductor device as claimed in claim 10, wherein the first and second conductive lines extend along the third, fourth, fifth or sixth conductive lines, such that the second ends of the first and second conductive lines are coupled to each other, and the first and second conductive lines overlap at least a portion of the third, fourth, fifth or sixth conductive lines.

12. The semiconductor device as claimed in claim 11, further comprising:
- a first extending portion and a second extending portion disposed in the second insulating layer, wherein the first extending portion and the second extending portion are correspondingly connected to the first ends of the sixth conductive lines and parallel to each other; and
- a third extending portion disposed in the first insulating layer and connected to the first conductive line or the second conductive line, wherein extending directions of the first and second extending portions are perpendicular to that of the third extending portion.

13. The semiconductor device as claimed in claim 1, further comprising a multi-layer interconnect structure disposed between the first insulating layer and the substrate, and connected to the first and second conductive lines through at least two conductive plugs.

14. The semiconductor device as claimed in claim 1, wherein the first pair of connection layers comprises an upper cross-connect layer disposed in the second insulating layer and a lower cross-connect layer disposed in the first insulating layer, wherein the upper cross-connect layer directly contacts the first end of the third conductive line of the second winding portion and indirectly connects to the first end of the first conductive line, and wherein the lower cross-connect directly contacts the first end of the second conductive line and indirectly connects to the first end of the third conductive line of the first winding portion.

15. The semiconductor device as claimed in claim 1, wherein the first conductive line and the second conductive line are formed on a first metal layer disposed on the first insulating layer and the third lines and the fourth lines are formed on a second metal layer disposed on the second insulating layer.

* * * * *